United States Patent [19]

Toda et al.

[11] 4,340,506
[45] Jul. 20, 1982

[54] PHOTOELECTRIC TRANSFER DEVICE

[75] Inventors: Kohji Toda, C-209, No. 2069 Futaba 1-chome, Yokosuka-shi, Kanagawa-ken, Japan; Koji Takahashi; Isao Matsufuji, both of Tokyo, Japan

[73] Assignees: TDK Electronics Co., Ltd., Tokyo; Kohji Toda, Yokosuka, both of Japan

[21] Appl. No.: 60,901

[22] Filed: Jul. 26, 1979

[30] Foreign Application Priority Data

| Jul. 26, 1978 [JP] | Japan | 53/091295 |
| Jul. 26, 1978 [JP] | Japan | 53/091296 |
| Jul. 26, 1978 [JP] | Japan | 53/091297 |
| Jul. 26, 1978 [JP] | Japan | 53/091298 |
| Jul. 26, 1978 [JP] | Japan | 53/091299 |
| Jul. 26, 1978 [JP] | Japan | 53/091300 |
| Jul. 26, 1978 [JP] | Japan | 53/091301 |

[51] Int. Cl.³ .......................................... H01C 13/00
[52] U.S. Cl. ................................ 252/501.1; 252/518; 252/520; 252/521; 252/500; 427/74; 427/124; 427/35; 428/389; 428/913; 250/211 R; 313/385; 313/384; 313/386; 430/84

[58] Field of Search .................. 252/501.1, 518, 520, 252/521, 500, 63.2, 63.5; 427/74, 89, 35, 123, 124, 75; 428/913, 364, 386, 375, 379, 914, 387, 389; 430/84, 85, 87, 88; 250/211 R; 313/385, 384, 386; 106/297, 298

[56] References Cited

U.S. PATENT DOCUMENTS

| 4,029,604 | 6/1977 | Enoki et al. | 252/501 |
| 4,040,985 | 8/1977 | Shidara et al. | 252/501.1 |
| 4,061,599 | 12/1977 | Marlor | 252/501 |
| 4,119,840 | 10/1978 | Nelson | 250/211 R |
| 4,147,667 | 4/1979 | Chevallier | 252/518 |
| 4,197,142 | 4/1980 | Bolton et al. | 250/211 R |
| 4,222,902 | 9/1980 | Huffman et al. | 252/501.1 |
| 4,241,158 | 12/1980 | Fukuda et al. | 427/74 |
| 4,242,373 | 12/1980 | Watanabe et al. | 427/74 |

*Primary Examiner*—Joseph L. Schofer
*Assistant Examiner*—J. L. Barr
*Attorney, Agent, or Firm*—Oblon, Fisher, Spivak, McClelland & Maier

[57] ABSTRACT

A photoelectric transfer device in which an electroconductive layer is formed on a surface of an oxide substrate comprising lead component at a ratio of 30–99.5 mol % as PbO and chromium component at a ratio of 0.5–70 mol %, preferably at a ratio of 60–90 mol % as PbO and a chromium component at a ratio of 10–40 mol %.

16 Claims, 8 Drawing Figures

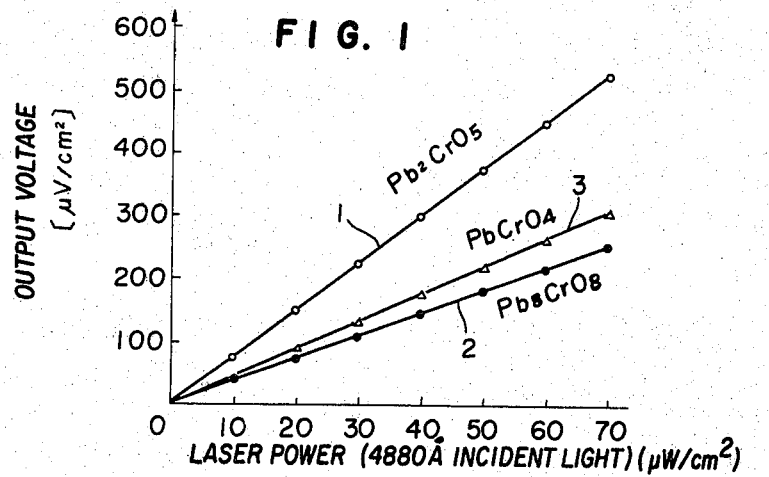
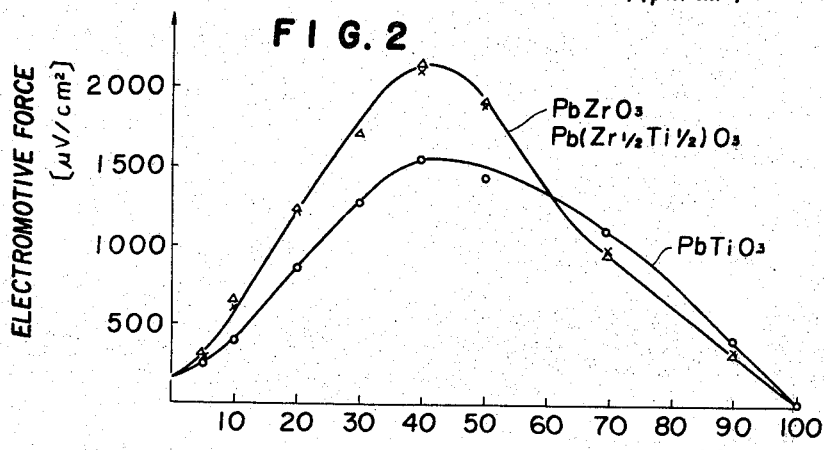
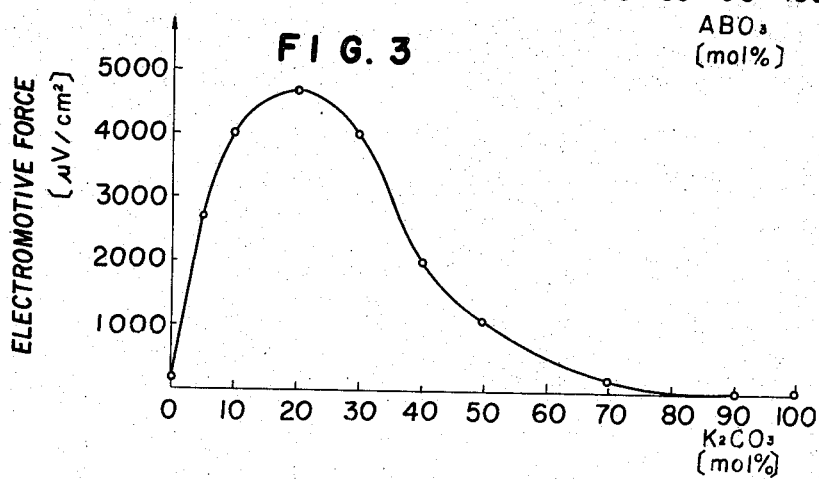

PHOTOELECTRIC TRANSFER DEVICE

BACKGROUND OF THE INVENTION

The present invention relates to a photoelectric transfer device. More particularly, it relates to a photoelectric transfer device in which an electric conductive layer is formed on an oxide comprising lead oxide PbO, chromium oxide $Cr_2O_3$ or its derivative.

It has been well known to use varying photoelectric transfer devices utilizing p-n or p-n-p junction of semiconductors or junction of a semiconductor and a metal.

These photoelectric transfer devices need not receive outer electromotive force, because electromotive force is generated from the photoelectric transfer device by exposing it to incident ray.

Such photoelectric transfer characteristic of a dielectric substance has not been disclosed. It has been known that SbS (I) has photoconductivity. Thus, it is necessary to use outer electromotive force for passing photocurrent. It has not been found to use a dielectric substance for studying the photoelectric transfer phenomenon. It has been considered and believed that such photoelectric transfer phenomenon is given by using a dielectric substance.

The inventors have found photoelectric transfer phenomenon of a dielectric substance in studies on oxide dielectric substances.

SUMMARY OF THE INVENTION

It is an object of the present invention to provide a photoelectric transfer device in which a dielectric substance is used.

It is another object of the present invention to provide an improved photoelectric transfer device in which a modified dielectric substance is used.

The foregoing and other objects of the present invention have been attained by providing a photoelectric device in which an electroconductive layer is formed on a surface of an oxide substrate comprising lead oxide and chromium oxide and if desired with other additives.

BRIEF DESCRIPTION OF THE DRAWINGS

FIG. 1 is a graph of variations of output voltage to laser power (4880 Å incident light);

FIGS. 2 to 8 respectively represent graphs of variations of electromotive force to contents of various additives incorporated in the oxide substrate.

DETAILED DESCRIPTION OF THE PREFERRED EMBODIMENTS

Figure 4:
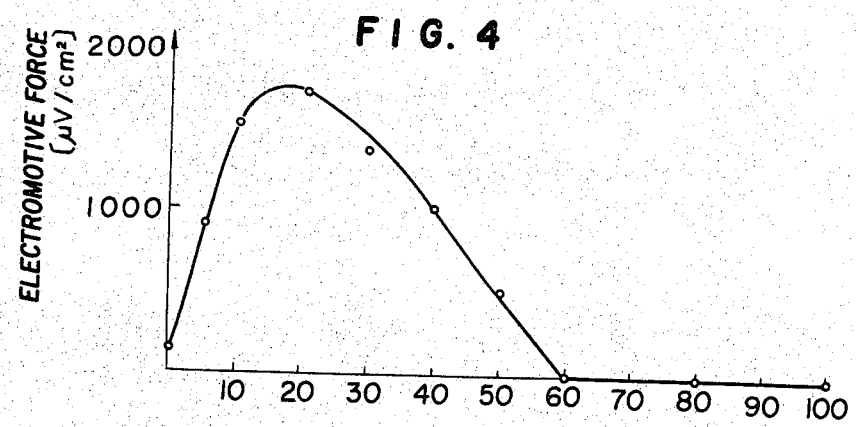

In accordance with the photoelectric transfer device of the present invention, incident ray input to the oxide substrate is transferred into current and the current is passed through the conductive layer to outside of the device.

When the oxide substrate is a thin film, electromotive force depending upon incident ray is formed to impart photosensitivity. On the other hand, when the oxide substrate is thick, charge storage effect is imparted.

The photoelectromotive force can be increased and the stability of the oxide substrate can be improved by incorporating an additional component in PbO and $Cr_2O_3$.

Suitable additional components include perovskite composite oxides such as $PbTiO_3$, $PbZrO_3$ as $Pb(Zr_{\frac{1}{2}}Ti_{\frac{1}{2}})O_3$; monovalent metal compounds such as $K_2CO_3$, $Li_2CO_3$, $Na_2CO_3$, $Rb_2CO_3$, $Cs_2CO_3$ and $Cu_2CO_3(CuO)$; pentavalent metal compounds such as $Nb_2O_5$ and $Ta_2O_5$; tetravalent metal compounds such as $TiO_2$, $SiO_2$ and $ZrO_2$; trivalent metal compounds such as $Al_2O_3$, and $In_2O_3$; hexavalent metal compounds such as $MoO_3$ and $WO_3$; and divalent metal compounds such as $BaCO_3$, $SrCO_3$ and $ZnCO_3$, (ZnO).

The main components PbO and $Cr_2O_3$ are blended at a ratio of 30–99.5 mol % of PbO to 0.5–70 mol % of $Cr_2O_3$.

The additional component is incorporated at each following ratio to the total of PbO and $Cr_2O_3$.

| | |
|---|---|
| perovskite composite oxides: | upto 95 mol %. |
| monovalent metal compounds: | upto 80 mol % as its carbonate. |
| pentavalent metal compounds: | upto 55 mol % as its oxide of $M^1_2O_5$ ($M^1$: metal (V)) |
| tetravalent metal compounds: | upto 55 mol % as its oxide of $M^2O_2$ ($M^2$: metal (IV)) |
| trivalent metal compounds: | upto 55 mol % as its oxide of $M^3_2O_3$ ($M^3$: metal(III)) |
| hexavalent metal compounds: | upto 60 mol % as its oxide of $M^4O_3$ ($M^4$: metal (VI)) |
| divalent metal compounds: | upto 55 mol % as its carbonate. |

The main components PbO and $Cr_2O_3$ and the additional component used in the present invention are preferably fine powders suitable for preparing a sintered dielectric substance having uniform structure.

The mixture is preferably calcined at 400°–500° C. and pulverized into fine powder. The calcined powder is mixed with a binder and molded by a press-molding and the molded product is sintered at 650°–900° C.

The surface of the sintered product is coated with a metal film such as aluminum, silver, copper or alloy, preferably by a vacuum evaporation method. A thickness of the metal film can be selected to be electroconductive and to result in photoelectric transfer such as 0.1 to 100 μm especially about 0.5 μm. The metal film is usually formed by depositing the metal on both surfaces of the dielectric substance.

EXAMPLE 1

Lead oxide PbO and chromium oxide $Cr_2O_3$ were used as starting materials and were weighed to give a ratio for a composition of $Pb_2CrO_5$. These starting materials were blended in wet condition for 10 to 15 hours in a polyethylene pot. The mixture was dried and calcined at 400° to 500° C. for 2 hours. After the calcination, the product was pulverized by a ball mill for 10 to 15 hours to obtain a powder having particle diameter of about 1μ. The calcined powder was admixed with a binder and the mixture was press-molded under a pressure of 1 ton/cm². The molded product was sintered at 650° to 900° C. for 2 hours to obtain a sintered product. A photoelectric transfer device is formed by coating an aluminum film on the surface of the sintered product by a vacuum evaporation method. A shape of the device is a disk having a diameter of 20 mm. and a thickness of 1 mm. and a disk having a diameter of 20 mm. and a thickness of 0.1 mm. An electrode having a diameter of 15 mm. and a thickness of 0.5 μm. was formed on each of the upper and lower surfaces of the sintered substrate.

The resulting photoelectric transfer device of the present invention was exposed to sunbeams (soft sunbeams) and the resulting photoelectromotive force was measured by a DC voltage meter. The resulting electromotive force was about 50 mV. When the incident ray was shut out to measure the electromotive force, the electromotive force of the device having a thickness of 0.1 mm. was zero whereas one having a thickness of 1 mm. was not zero.

That is, it was found that the photosensitivity was high in the thin film type device whereas the charge storage effect was high in the thick article.

EXAMPLE 2

In accordance with the process of Example 1, a photoelectric transfer device was prepared by the same method at the same ratio of the components except varying a thickness and its photosensitivity was measured. As a result, the photosensitivity was remarkably inferior when thickness was greater than 0.2 mm. whereas the charge storage effect was increased depending upon the increase of the thickness.

EXAMPLE 3

In accordance with the process of Example 1 or 2, a photoelectric transfer device was prepared at the ratio for a composition of $Pb_5CrO_8$.

In accordance with the method of Example 1, a photoelectromotive force was measured by using sunbeams (soft sunbeams) as the light source to give 30 mV. The photosensitivity was substantially the same with those of Examples 1 and 2.

EXAMPLE 4

In accordance with the process of Example 1 or 2, a photoelectric transfer device was prepared at the ratio for a composition of $PbCrO_4$.

In accordance with the method of Example 1, photoelectromotive force was measured by using sunbeams (soft sunbeams) as the light source to give 35 mV. The photosensitivity was substantially the same with those of Example 1 or 2.

In all of the examples, excellent photoelectromotive force was given.

Each photoelectric transfer device was prepared by the process of Example 1 by varying a ratio of PbO to $Cr_2O_3$. As results, the photoelectromotive force effect was not substantially found when a ratio of $Cr_2O_3$ was higher than 70 mol %.

The photoelectromotive force effect was not substantially found when a ratio of PbO was higher than 99.5 mol %.

The ratios of PbO to $Cr_2O_3$ are as follows. A mixed crystal of $PbCrO_4$ and $Cr_2O_3$ is formed when the content of $Cr_2O_3$ is excess to the ratio for $PbCrO_4$. A mixed crystal of $Pb_5CrO_8$ and PbO is formed when the content of PbO is excess to the ratio for $Pb_5CrO_8$. A mixed crystal of a combination of ones selected from PbO, $Cr_2O_3$, $Pb_2CrO_5$ and $Pb_5CrO_8$ is formed at a ratio of the middle range.

Each laser ray was applied to each of the photoelectric transfer device of Examples 1, 3 and 4 which has a thickness of 0.1 mm. and the relation of the laser power and the output voltage of the photoelectric transfer device was measured. The results are shown in FIG. 1. The intensity of the laser ray was varied in a range of 0 to 70 $\mu W/cm^2$ by using a filter for a wavelength of 4800 Å. The output voltage was varied depending upon the variation of the laser power as shown in FIG. 1 wherein the curves (1), (2) and (3) respectively show the results of Examples 1, 2, and 3.

EXAMPLE 5

Lead oxide PbO and chromium oxide $Cr_2O_3$ were used as starting materials and were weighed to give a ratio for a composition of $Pb_2CrO_5$.

As each additional component, $PbTiO_3$, $PbZrO_3$ or $Pb(Zr_{\frac{1}{2}}Ti_{\frac{1}{2}})O_3$ was respectively incorporated at a range of less than 95 mol %.

These starting materials were blended in wet condition for 10 to 15 hours in a polyethylene pot. The mixture was dried and calcined at 400° to 500° C. for 2 hours. After the calcination, the product was pulverized by a ball mill for 10 to 15 hours to obtain a powder having particle diameter of about 1$\mu$. The calcined powder was admixed with a binder and the mixture was press-molded under a pressure of 1 ton/cm$^2$. The molded product was sintered at 650° to 900° C. for 2 hours to obtain a sintered product. A photoelectric transfer device is formed by coating an aluminum film on the surface of the sintered product by a vacuum evaporation method. A shape of the device is a disk having a diameter of 20 mm. and a thickness of 1 mm. and a disk having a diameter of 20 mm. and a thickness of 0.1 mm. An electrode having a diameter of 15 mm. and a thickness of 0.5 $\mu$m. was formed on each of the upper and lower surfaces of the sintered substrate.

Each resulting photoelectric transfer device of the present invention was exposed to laser beam having a laser power of 20 $\mu W/cm^2$ at a wavelength of 4880 Å and each photoelectromotive force was measured by a DC voltage meter. The results are shown in Table 1 and plotted in FIG. 2.

As it is clearly understood from Table 2 and FIG. 1, the maximum value was given in a content of the additional component of about 40 mol % and was higher than 1550 $\mu V/cm^2$ in the case of $PbTiO_3$; higher than 2140 $\mu V/cm^2$ in the case of $PbZrO_3$ and higher than 2100 $\mu V/cm^2$ in the case of $Pb(Zr_{\frac{1}{2}}Ti_{\frac{1}{2}})O_3$.

An electromotive force of the device was measured by masking the device from incident ray. When a thickness of the disk was 0.1 mm, the electromotive force was zero. However, when a thickness of the disk was 1 mm, it was not zero. This fact shows that a thin device has high photosensitivity whereas a thick device has high charge storage effect.

TABLE 1

| Additional component mol % | Photoelectromotive force ($\mu V/cm^2$) | | |
|---|---|---|---|
| | $PbTiO_3$ | $PbZrO_3$ | $Pb(Zr_{\frac{1}{2}}Ti_{\frac{1}{2}})O_3$ |
| 0 | 150 | 150 | 150 |
| 5 | 250 | 320 | 300 |
| 10 | 400 | 650 | 600 |
| 20 | 850 | 1220 | 1200 |
| 30 | 1250 | 1700 | 1700 |
| 40 | 1550 | 2140 | 2100 |
| 50 | 1400 | 1910 | 1900 |
| 70 | 1100 | 940 | 950 |
| 90 | 400 | 310 | 300 |
| 100 | 0 | 0 | 0 |

EXAMPLE 6

In accordance with the process of Example 5, each photoelectric transfer device was prepared by blending PbO and $Cr_2O_3$ to give $PbCrO_4$ or $Pb_5CrO_8$ and adding 10 mol % of $Pb(Zr_{\frac{1}{2}}Ti_{\frac{1}{2}})O_3$.

As results, the photoelectromotive forces of the devices were respectively 720 $\mu V/cm^2$ in the case of $PbCrO_4$ and 660 $\mu V/cm^2$ in the case of $Pb_5CrO_8$.

EXAMPLE 7

Lead oxide PbO and chromium oxide $Cr_2O_3$ were used as starting materials and were weighed to give a ratio for a composition of $Pb_2CrO_5$. As an additional component, $K_2CO_3$ was incorporated at a range of 5-90 mol %.

These starting materials were blended in wet condition for 10 to 15 hours in a polyethylene pot. The mixture was dried and calcined at 400° to 500° C. for 2 hours. After the calcination, the product was pulverized by a ball mill for 10 to 15 hours to obtain a powder having particle diameter of about $1\mu$. The calcined powder was admixed with a binder and the mixture was press-molded under a pressure of 1 $ton/cm^2$. The molded product was sintered at 650° to 900° C. for 2 hours to obtain a sintered product. A photoelectric transfer device is formed by coating an aluminum film on the surface of the sintered product by a vacuum evaporation method. A shape of the device is a disk having a diameter of 20 mm and a thickness of 1 mm. and a disk having a diameter of 20 mm. and a thickness of 0.1 mm. An electrode having a diameter of 15 mm. and a thickness of 0.5 $\mu m$. was formed on each of the upper and lower surfaces of the sintered substrate.

Each resulting photoelectric transfer device of the present invention was exposed to laser beam having a laser power of 20 $\mu W/cm^2$ at a wavelength of 4880 Å and each photoelectromotive force was measured by a DC voltage meter. The results are shown in Table 2 and plotted in FIG. 3.

As it is clearly understood from Table 2 and FIG. 3, the maximum value was given in a content of $K_2CO_3$ of about 20 mol % and was higher than 4700 $\mu V/cm^2$. An electromotive force of the device was measured by masking the device from incident ray. When a thickness of the disk was 0.1 mm, the electromotive force was zero. However, when a thickness of the disk was 1 mm, it was not zero. This fact shows that a thin device has high photosensitivity, whereas a thick device has high charge storage effect.

TABLE 2

| $K_2CO_3$ (mol %) | Photoelectromotive force ($\mu V/cm^2$) |
| --- | --- |
| 0 | 150 |
| 5 | 2700 |
| 10 | 4000 |
| 20 | 4700 |
| 30 | 4000 |
| 40 | 2000 |
| 50 | 1100 |
| 70 | 200 |
| 90 | 0 |
| 100 | 0 |

EXAMPLE 8

In accordance with the process of Example 7, each photoelectric transfer device was prepared by blending PbO and $Cr_2O_3$ to give $PbCrO_4$ or $Pb_5CrO_8$ and adding 10 mol % of $K_2CO_3$.

As results, the photoelectromotive forces of the devices were respectively, 2820 $\mu V/cm^2$ in the case of $PbCrO_4$ and 2600 $\mu V/cm^2$ in the case of $Pb_5CrO_8$.

EXAMPLE 9

In accordance with the process of Example 7 except using 10 mol % of $Li_2CO_3$, $Na_2CO_3$, $Rb_2CO_3$ or $Cs_2CO_3$ instead of $K_2CO_3$, each photoelectric transfer device was prepared and each photoelectromotive force was measured.

In the other test, $Cu_2O$ was used instead of $K_2CO_3$. The results are shown in Table 3.

TABLE 3

| Additional component (10 mol %) | Photoelectromotive force ($\mu V/cm^2$) |
| --- | --- |
| $K_2CO_3$ | 4700 |
| $Li_2CO_3$ | 3800 |
| $Na_2CO_3$ | 4200 |
| $Rb_2CO_3$ | 4000 |
| $Cs_2CO_3$ | 4050 |
| $Cu_2CO_3(Cu_2O)$ | 3900 |

EXAMPLE 10

Lead oxide PbO and chromium oxide $Cr_2O_3$ were used as starting materials and were weighed to give a ratio for a composition of $Pb_2CrO_5$. As an additional component, $Nb_2O_5$ was incorporated at a range of 5-80 mol %.

These starting materials were blended in wet condition for 10 to 15 hours in a polyethylene pot. The mixture was dried and calcined at 400° to 500° C. for 2 hours. After the calcination, the product was pulverized by a ball mill for 10 to 15 hours to obtain a powder having particle diameter of about $1\mu$. The calcined powder was admixed with a binder and the mixture was press-molded under a pressure of 1 $ton/cm^2$. The molded product was sintered at 650° to 900° C. for 2 hours to obtain a sintered product. A photoelectric transfer device is formed by coating an aluminum film on the surface of the sintered product by a vacuum evaporation method. A shape of the device is a disk having a diameter of 20 mm and a thickness of 1 mm. and a disk having a diameter of 20 mm. and a thickness of 0.1 mm. An electrode having a diameter of 15 mm. and a thickness of 0.5 $\mu m$. was formed on each of the upper and lower surfaces of the sintered substrate.

Each resulting photoelectric transfer device of the present invention was exposed to laser beam having a laser power of 20 $\mu W/cm^2$ at a wavelength of 4880 Å and each photoelectromotive force was measured by a DC voltage meter. The results are shown in Table 4 and plotted in FIG. 4.

As it is clearly understood from Table 4 and FIG. 4, the maximum value was given in a content of $Nb_2O_5$ of about 20 mol % and was higher than 1700 $\mu V/cm^2$. An electromotive force of the device was measured by masking the device from incident ray. When a thickness of the disk was 0.1 mm, the electromotive force was zero. However, when a thickness of the disk was 1 mm, it was not zero. This fact shows that a thin device has high photosensitivity, whereas a thick device has high charge storage effect.

TABLE 4

| Additional component $Nb_2O_5$ (mol %) | Photoelectromotive force ($\mu V/cm^2$) |
| --- | --- |
| 0 | 150 |
| 5 | 900 |
| 10 | 1500 |
| 20 | 1700 |

TABLE 4-continued

| Additional component Nb$_2$O$_5$ (mol %) | Photoelectromotive force ($\mu$V/cm$^2$) |
| --- | --- |
| 30 | 1350 |
| 40 | 1000 |
| 50 | 500 |
| 60 | 0 |
| 80 | 0 |
| 100 | 0 |

EXAMPLE 11

In accordance with the process of Example 10, each photoelectric transfer device was prepared by blending PbO and Cr$_2$O$_3$ to give PbCrO$_4$ or Pb$_5$CrO$_8$ and adding 10 mol % of Nb$_2$O$_5$.

As results, the photoelectromotive forces of the devices were respectively, 900 $\mu$V/cm$^2$ in the case of PbCrO$_4$ and 720 $\mu$V/cm$^2$ in the case of Pb$_5$CrO$_8$.

EXAMPLE 12

In accordance with the process of Example 10 except using 10 mol % of Ta$_2$O$_5$ instead of Nb$_2$O$_5$, each photoelectric transfer device was prepared and each photoelectromotive force was measured. The results are shown in Table 5.

TABLE 5

| Additional component (10 mol %) | Photoelectromotive force ($\mu$V/cm$^2$) |
| --- | --- |
| Nb$_2$O$_5$ | 1500 |
| Ta$_2$O$_5$ | 1400 |

EXAMPLE 13

Lead oxide PbO and chromium oxide Cr$_2$O$_3$ were used as starting materials and were weighed to give a ratio for a composition of Pb$_2$CrO$_5$. As an additional component, TiO$_2$ was incorporated at a range of 5–80 mol %.

These starting materials were blended in wet condition for 10 to 15 hours in a polyethylene pot. The mixture was dried and calcined at 400° to 500° C. for 2 hours. After the calcination, the product was pulverized by a ball mill for 10 to 15 hours to obtain a powder having particle diameter of about 1$\mu$. The calcined powder was admixed with a binder and the mixture was press-molded under a pressure of 1 ton/cm$^2$. The molded product was sintered at 650° to 900° C. for 2 hours to obtain a sintered product. A photoelectric transfer device is formed by coating an aluminum film on the surface of the sintered product by a vacuum evaporation method. A shape of the device is a disk having a diameter of 20 mm and a thickness of 1 mm. and a disk having a diameter of 20 mm. and a thickness of 0.1 mm. An electrode having a diameter of 15 mm. and a thickness of 0.5 $\mu$m. was formed on each of the upper and lower surfaces of the sintered substrate.

Each resulting photoelectric transfer device of the present invention was exposed to laser beam having a laser power of 20 $\mu$W/cm$^2$ at a wavelength of 4880 Å and each photoelectromotive force was measured by a DC voltage meter. The results are shown in Table 6 and plotted in FIG. 5.

Figure 5:
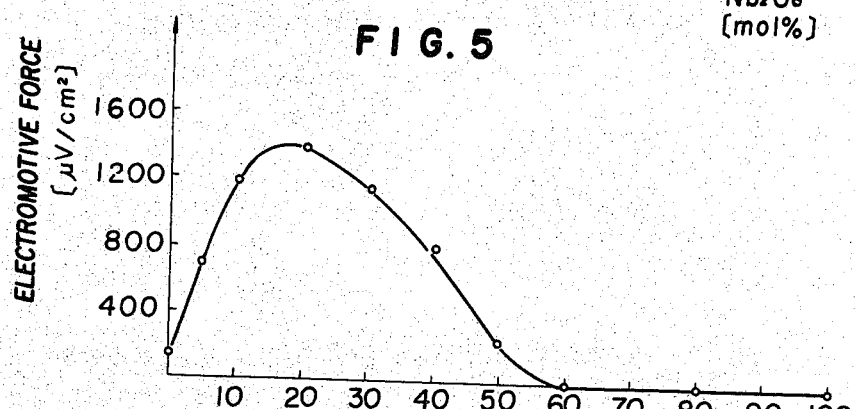

As it is clearly understood from Table 6 and FIG. 5, the maximum value was given in a content of TiO$_2$ of about 20 mol % and was higher than 1400 $\mu$V/cm$^2$. An electromotive force of the device was measured by masking the device from incident ray. When a thickness of the disk was 0.1 mm, the electromotive force was zero. However, when a thickness of the disk was 1 mm, it was not zero. This fact shows that a thin device has high photosensitivity, whereas a thick device has high charge storage effect.

TABLE 6

| Additional component TiO$_2$ (mol %) | Photoelectromotive force ($\mu$V/cm$^2$) |
| --- | --- |
| 0 | 150 |
| 5 | 700 |
| 10 | 1200 |
| 20 | 1400 |
| 30 | 1150 |
| 40 | 800 |
| 50 | 250 |
| 60 | 0 |
| 80 | 0 |
| 100 | 0 |

EXAMPLE 14

In accordance with the process of Example 13, each photoelectric transfer device was prepared by blending PbO and Cr$_2$O$_3$ to give PbCrO$_4$ or Pb$_5$CrO$_8$ and adding 10 mol % of TiO$_2$.

As results, the photoelectromotive forces of the devices were respectively, 720 $\mu$V/cm$^2$ in the case of PbCrO$_4$ and 580 $\mu$V/cm$^2$ in the case of Pb$_5$CrO$_8$.

EXAMPLE 15

In accordance with the process of Example 14 except using 10 mol % of SiO$_2$ or ZrO$_2$ instead of TiO$_2$, each photoelectric transfer device was prepared and each photoelectromotive force was measured. The results are shown in Table 7.

TABLE 7

| Additional component (10 mol %) | Photoelectromotive force ($\mu$V/cm$^2$) |
| --- | --- |
| TiO$_2$ | 1200 |
| SiO$_2$ | 1100 |
| ZrO$_2$ | 1150 |

EXAMPLE 16

Lead oxide PbO and chromium oxide Cr$_2$O$_3$ were used as starting materials and were weighed to give a ratio for a composition of Pb$_2$CrO$_5$. As an additional component, Al$_2$O$_3$ was incorporated at a range of 5–80 mol %.

These starting materials were blended in wet condition for 10 to 15 hours in a polyethylene pot. The mixture was dried and calcined at 400° to 500° C. for 2 hours. After the calcination, the product was pulverized by a ball mill for 10 to 15 hours to obtain a powder having particle diameter of about 1$\mu$. The calcined powder was admixed with a binder and the mixture was press-molded under a pressure of 1 ton/cm$^2$. The molded product was sintered at 650° to 900° C. for 2 hours to obtain a sintered product. A photoelectric transfer device is formed by coating an aluminum film on the surface of the sintered product by a vacuum evaporation method. A shape of the device is a disk having a diameter of 20 mm and a thickness of 1 mm. and a disk having a diameter of 20 mm. and a thickness of 0.1 mm. An electrode having a diameter of 15 mm.

and a thickness of 0.5 μm. was formed on each of the upper and lower surfaces of the sintered substrate.

Each resulting photoelectric transfer device of the present invention was exposed to laser beam having a laser power of 20 μW/cm$^2$ at a wavelength of 4880 Å and each photoelectromotive force was measured by a DC voltage meter. The results are shown in Table 8 and plotted in FIG. 6.

Figure 6:
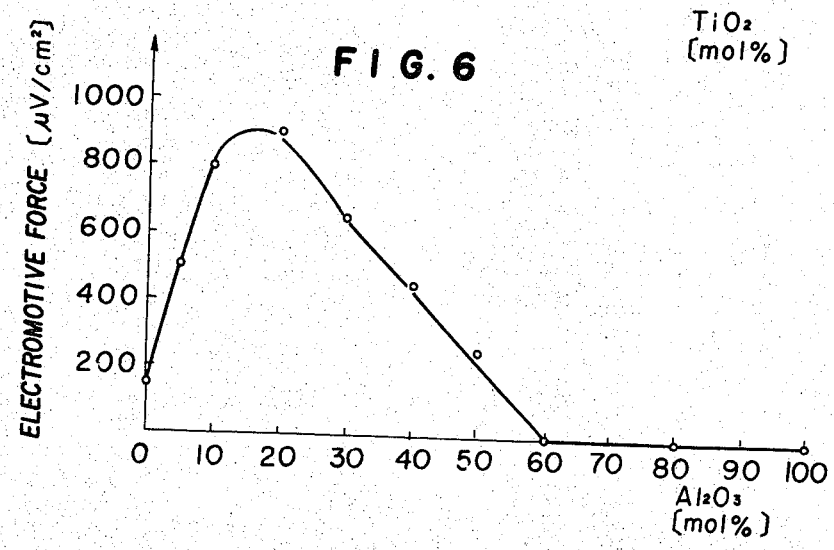

As it is clearly understood from Table 8 and FIG. 6, the maximum value was given in a content of Al$_2$O$_3$ of about 20 mol % and was higher than 900 μV/cm$^2$. An electromotive force of the device was measured by masking the device from incident ray. When a thickness of the disk was 0.1 mm, the electromotive force was zero. However, when a thickness of the disk was 1 mm, it was not zero. This fact shows that a thin device has high photosensitivity, whereas a thick device has high charge storage effect.

TABLE 8

| Additional component Al$_2$O$_2$ (mol %) | Photoelectromotive force (μV/cm$^2$) |
| --- | --- |
| 0 | 150 |
| 5 | 500 |
| 10 | 800 |
| 20 | 900 |
| 30 | 650 |
| 40 | 450 |
| 50 | 250 |
| 60 | 0 |
| 80 | 0 |
| 100 | 0 |

EXAMPLE 17

In accordance with the process of Example 16, each photoelectric transfer device was prepared by blending PbO and Cr$_2$O$_3$ to give PbCrO$_4$ or Pb$_5$CrO$_8$ and adding 10 mol % of Al$_2$O$_3$.

As results, the photoelectromotive forces of the devices were respectively, 480 μV/cm$^2$ in the case of PbCrO$_4$ and 380 μV/cm$^2$ in the case of Pb$_5$CrO$_8$.

EXAMPLE 18

In accordance with the process of Example 16 except using 10 mol % of In$_2$O$_3$ instead of Al$_2$O$_3$, each photoelectric transfer device was prepared and each photoelectromotive force was measured. The results are shown in Table 9.

TABLE 9

| Additional component (10 mol %) | Photoelectromotive force (μV/cm$^2$) |
| --- | --- |
| Al$_2$O$_2$ | 800 |
| In$_2$O$_2$ | 600 |

EXAMPLE 19

Lead oxide PbO and chromium oxide Cr$_2$O$_3$ were used as starting materials and were weighed to give a ratio for a composition of Pb$_2$CrO$_5$. As an additional component, WO$_3$ was incorporated at a range of less than 60 mol %.

These starting materials were blended in wet condition for 10 to 15 hours in a polyethylene pot. The mixture was dried and calcined at 400° to 500° C. for 2 hours. After the calcination, the product was pulverized by a ball mill for 10 to 15 hours to obtain a powder having particle diameter of about 1μ. The calcined powder was admixed with a binder and the mixture was press-molded under a pressure of 1 ton/cm$^2$. The molded product was sintered at 650° to 900° C. for 2 hours to obtain a sintered product. A photoelectric transfer device is formed by coating an aluminum film on the surface of the sintered product by a vacuum evaporation method. A shape of the device is a disk having a diameter of 20 mm and a thickness of 1 mm. and a disk having a diameter of 20 mm. and a thickness of 0.1 mm. An electrode having a diameter of 15 mm. and a thickness of 0.5 μm. was formed on each of the upper and lower surfaces of the sintered substrate.

Each resulting photoelectric transfer device of the present invention was exposed to laser beam having a laser power of 20 μW/cm$^2$ at a wavelength of 4880 Å and each photoelectromotive force was measured by a DC voltage meter. The results are shown in Table 10 and plotted in FIG. 7.

Figure 7:
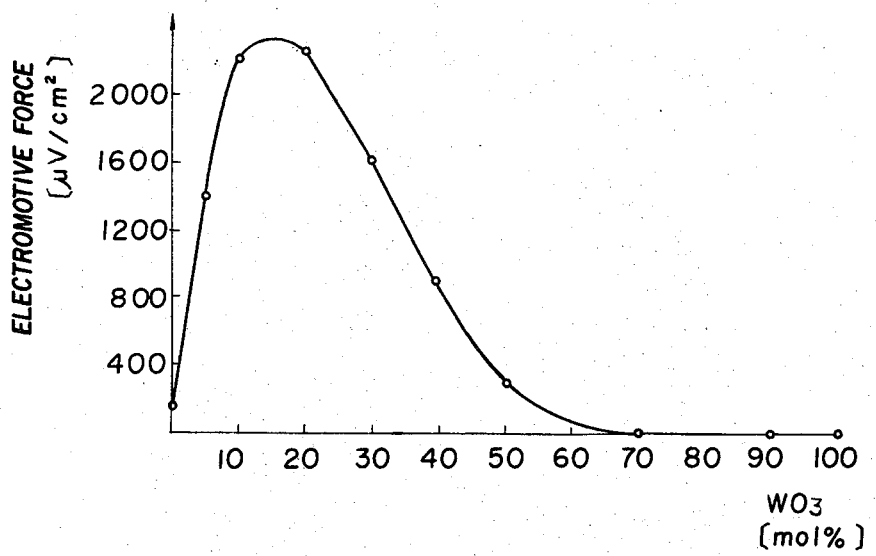

As it is clearly understood from Table 10 and FIG. 7, the maximum value was given in a content of WO$_3$ of about 20 mol % and was higher than 2250 μV/cm$^2$. An electromotive force of the device was measured by masking the device from incident ray. When a thickness of the disk was 0.1 mm, the electromotive force was zero. However, when a thickness of the disk was 1 mm, it was not zero. This fact shows that a thin device has high photosensitivity, whereas a thick device has high charge storage effect.

TABLE 10

| Additional component WO$_3$ (mol %) | Photoelectromotive force (μV/cm$^2$) |
| --- | --- |
| 0 | 150 |
| 5 | 1400 |
| 10 | 2200 |
| 20 | 2250 |
| 30 | 1600 |
| 40 | 900 |
| 50 | 300 |
| 70 | 0 |
| 90 | 0 |
| 100 | 0 |

EXAMPLE 20

In accordance with the process of Example 19, each photoelectric transfer device was prepared by blending PbO and Cr$_2$O$_3$ to give PbCrO$_4$ or Pb$_5$CrO$_8$ and adding 10 mol % of WO$_3$.

As results, the photoelectromotive forces of the devices were respectively, 1350 μV/cm$^2$ in the case of PbCrO$_4$ and 1240 μV/cm$^2$ in the case of Pb$_5$CrO$_8$.

EXAMPLE 21

In accordance with the process of Example 19 except using 10 mol % of MoO$_3$ instead of WO$_3$, each photoelectric transfer device was prepared and each photoelectromotive force was measured. As a result, excellent photoelectromotive force of 2100 μV/cm$^2$ was given in the case of MoO$_3$.

EXAMPLE 22

Lead oxide PbO and chromium oxide Cr$_2$O$_3$ were used as starting materials and were weighed to give a ratio for a composition of Pb$_2$CrO$_5$. As an additional component, BaCO$_3$ was incorporated at a range of 5–80 mol %.

These starting materials were blended in wet condition for 10 to 15 hours in a polyethylene pot. The mixture was dried and calcined at 400° to 500° C. for 2 hours. After the calcination, the product was pulverized by a ball mill for 10 to 15 hours to obtain a powder having particle diameter of about 1μ. The calcined powder was admixed with a binder and the mixture was press-molded under a pressure of 1 ton/cm². The molded product was sintered at 650° to 900° C. for 2 hours to obtain a sintered product. A photoelectric transfer device is formed by coating an aluminum film on the surface of the sintered product by a vacuum evaporation method. A shape of the device is a disk having a diameter of 20 mm and a thickness of 1 mm. and a disk having a diameter of 20 mm, and a thickness of 0.1 mm. An electrode having a diameter of 15 mm. and a thickness of 0.5 μm. was formed on each of the upper and lower surfaces of the sintered substrate.

Each resulting photoelectric transfer device of the present invention was exposed to laser beam having a laser power of 20 μW/cm² at a wavelength of 4880 Å and each photoelectromotive force was measured by a DC voltage meter. The results are shown in Table 11 and plotted in FIG. 8.

Figure 8:
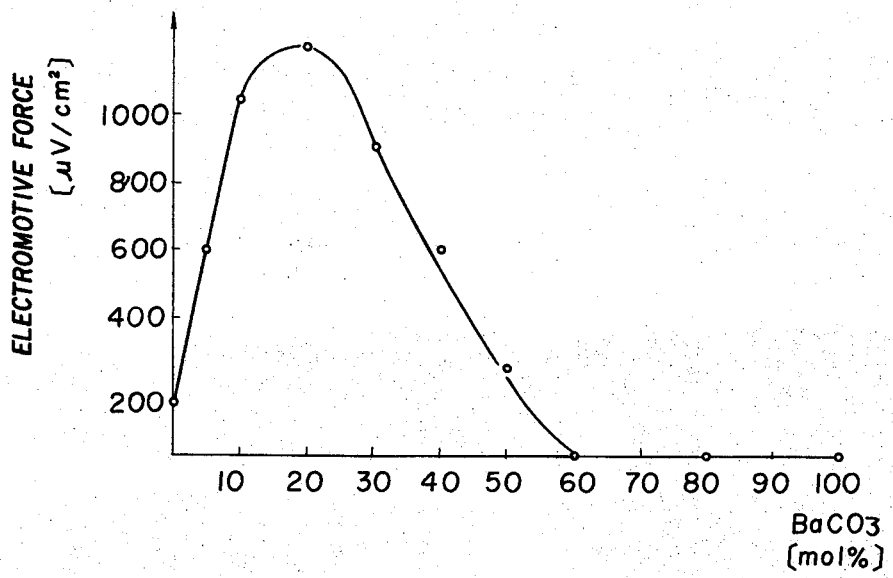

As it is clearly understood from Table 11 and FIG. 8, the maximum value was given in a content of $BaCO_3$ of about 20 mol % and was higher than 1200 μV/cm². An electromotive force of the device was measured by masking the device from incident ray. When a thickness of the disk was 0.1 mm, the electromotive force was zero. However, when a thickness of the disk was 1 mm, it was not zero. This fact shows that a thin device has high photosensitivity, whereas a thick device has high charge storage effect.

TABLE 11

| Additional component $BaCO_2$ (mol %) | Photoelectromotive force (μV/cm²) |
| --- | --- |
| 0 | 150 |
| 5 | 600 |
| 10 | 1050 |
| 20 | 1200 |
| 30 | 900 |
| 40 | 600 |
| 50 | 250 |
| 60 | 0 |
| 80 | 0 |
| 100 | 0 |

EXAMPLE 23

In accordance with the process of Example 22, each photoelectric transfer device was prepared by blending PbO and $Cr_2O_3$ to give $PbCrO_4$ or $Pb_5CrO_8$ and adding 10 mol % of $BaCO_3$.

As results, the photoelectromotive forces of the devices were respectively, 630 μV/cm² in the case of $PbCrO_4$ and 500 μV/cm² in the case of $Pb_5CrO_8$.

EXAMPLE 24

In accordance with the process of Example 22 except using 10 mol % of $SrCO_3$ or $ZnCO_3$ instead of $BaCO_3$, each photoelectric transfer device was prepared and each photoelectromotive force was measured.

In the other test, ZnO was used instead of $ZnCO_3$. The results are shown in Table 12.

TABLE 12

| Additional component (10 mol %) | Photoelectromotive force (μV/cm²) |
| --- | --- |
| $BaCO_3$ | 1050 |
| $SrCO_3$ | 900 |

TABLE 12-continued

| Additional component (10 mol %) | Photoelectromotive force (μV/cm²) |
| --- | --- |
| $ZnCO_3$(ZnO) | 800 |

As described above, the present invention provides a photoelectric transfer device in which an electroconductive layer is formed on a surface of the oxide substrate comprising lead oxide and chromium oxide. The present invention to also to provide a process for producing a photoelectric transfer device which comprises mixing lead oxide and chromium oxide and sintering the mixture and coating an electroconductive layer on the sintered substrate.

Excellent photoelectromotive force is generated. When it is a thin film, excellent photosensitivity is given, whereas when it is a thick plate, charge storage effect imparts. The elements can be prepared as sintered porcelains by sintering and accordingly, the elements can be prepared in mass production and stable so as to be economical. The photoelectric transfer device has advantageously high strength and high durability which are not found in conventional photoelectric transfer devices.

It is important to form at least two conductive layers as electrodes on the oxide substrate. The conductive layers are usually formed on both surfaces of the oxide substrate in a form of a sheet or a film.

It is also possible to form the separated conductive layers on one surface of the oxide substrate.

The oxide substrate can be formed in various shape such as a sheet, a rod and a film. It is also possible to form the oxide substrate by a vacuum deposition by an electron beam method wherein electron beams are radiated to said specific oxides in vacuum to deposit the evaporated oxides on a supporter. The thickness of the oxide substrate can be about 10μ.

We claim:

1. A photoelectric transfer device in which an electroconductive layer having a thickness enabling photoelectric transfer of 0.1 to 100μ is coated on a surface of a solid oxide substrate comprising a lead component at a ratio of 30-99.5 mol % as PbO and an oxide of chromium component at a ratio of 0.5-70 mol %, said substrate being uniformly and integrally associated in a unitary mass as a sheet, rod, plate or film.

2. A photoelectric transfer device according to claim 1 wherein the oxide substrate comprises a lead component at a ratio of 60-90 mol % as PbO and a chromium component at a ratio of 10-40 mol %.

3. A photoelectric transfer device according to claim 1 wherein the oxide substrate is a sintered product in a plate form.

4. A photoelectric transfer device according to claim 3 wherein the electroconductive layer is formed on both surfaces of the sintered product in a plate form.

5. A photoelectric transfer device according to claim 3 wherein a thickness of the sintered product is less than 0.2 mm.

6. A photoelectric transfer device according to claim 3 wherein a thickness of the sintered product is greater than 0.2 mm.

7. A photoelectric transfer device according to claim 1 wherein the oxide substrate is selected from the group consisting of $Pb_5CrO_8$, $Pb_2CrO_5$, $PbCrO_4$ and mixtures thereof.

8. A photoelectric transfer device according to claim 1 wherein a perovskite composite oxide, lead titanate or lead zirconate, is incorporated at the ratio of up to 95 mol % based on the total of PbO and $Cr_2O_3$.

9. A photoelectric transfer device according to claim 1 wherein a monovalent metal compound $K_2CO_3$, $Li_2CO_3$, $Na_2CO_3$, $Rb_2CO_3$, $Cs_2CO_3$, and $Cu_2CO_3(CuO)$ is incorporated at a ratio of up to 80 mol % as its carbonate based on the total of PbO and $Cr_2O_3$.

10. A photoelectric transfer device according to claim 1 wherein a pentavalent metal compound is incorporated at a ratio of up to 55 mol % as $M_2^1O_5$, $M^1$: metal of group V, selected from the group consisting of Nb and Ta, based on the total of PbO and $Cr_2O_3$.

11. A photoelectric transfer device according to claim 1 wherein a tetravalent metal compound is incorporated at a ratio of up to 55 mol % as $M^2O_2$, $M^2$: metal of group IV, selected from the group consisting of Ti, Si or Zr, based on the total of PbO and $Cr_2O_3$.

12. A photoelectric transfer device according to claim 1 wherein a trivalent metal compound is incorporated at a ratio of up to 55 mol % as $M_2^3O_3$, $M^3$: metal of group III, selected from the group consisting of Al and In, based on the total of PbO and $Cr_2O_3$.

13. A photoelectric transfer device according to claim 1 wherein a hexavalent metal compound is incorporated at a ratio of up to 60 mol % as $M^4O_3$, $M^4$: metal of group VI, selected from the group consisting of Mo and W, based on the total of PbO and $Cr_2O_3$.

14. A photoelectric transfer device according to claim 1 wherein a divalent metal compound is incorporated at a ratio of up to 55 mol % as its carbonate based on the total of PbO and $Cr_2O_3$, wherein the divalent metal is Zn, Sr or Ba.

15. A photoelectric transfer device according to claim 1 wherein the oxide substrate is a film deposited on a supporter by an electron beam method in vacuum.

16. The photoelectric transfer device of claim 3 wherein the sintered product is formed by sintering at 650°–900° C.

* * * * *